(12) United States Patent
Blackburn et al.

(10) Patent No.: US 8,067,875 B1
(45) Date of Patent: Nov. 29, 2011

(54) NETWORKED STRUCTURE OF ELECTROACTIVE POLYMER-BASED ARTIFICIAL NEUROMUSCULAR UNITS

(75) Inventors: Michael R. Blackburn, Encinitas, CA (US); Wayne C. McGinnis, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 472 days.

(21) Appl. No.: 12/422,697

(22) Filed: Apr. 13, 2009

(51) Int. Cl.
*H01L 41/08* (2006.01)

(52) U.S. Cl. .................. 310/328; 310/800; 310/311

(58) Field of Classification Search .......... 310/800, 310/311, 330, 332, 328; *H01I 41/08, 41/09*
See application file for complete search history.

(56) References Cited

U.S. PATENT DOCUMENTS

| | | | |
|---|---|---|---|
| 6,157,113 A | 12/2000 | Hunter et al. | |
| 6,249,076 B1 | 6/2001 | Madden et al. | |
| 6,574,958 B1 | 6/2003 | MacGregor | |
| 6,806,511 B2 | 10/2004 | Armgarth et al. | |
| 6,833,656 B2 | 12/2004 | Hooley et al. | |
| 6,936,955 B1 | 8/2005 | Smela et al. | |
| 7,193,350 B1 * | 3/2007 | Blackburn et al. | 310/311 |
| 7,948,151 B1 * | 5/2011 | Blackburn et al. | 310/800 |
| 2003/0212356 A1 * | 11/2003 | Scorvo | 602/20 |
| 2008/0303782 A1 * | 12/2008 | Grant et al. | 345/156 |

OTHER PUBLICATIONS

Federico Carpi and Danilo De Rossi, Electroactive Polymer-Based Devices for e-Textiles in Biomedicine, IEEE Transactions on Information Technology in Biomedicine, vol. 9, No. 3, Sep. 2005, 295.

Miaoxiang Chen, Printed Electrochemical devices using conducting polymers as active materials on flexible substrates, Proceedings of the IEEE, vol. 33, No. 7, Jul. 2005, 1339-1347.

Zheng Chen et al., Integrated Sensing for Ionic Polymer-Metal Composit Actuators Using PVDF Thin Films, Smart Materials and Structures, vol. 16, 2007, S262-S271.

Evan Malone and Hod Lipson, Freeform Fabrication of Electroactive Polymer Actuators and Electromechanical Devices, available at http://ccsl.mae.cornell.edu/papers/SFF04_Malone.pdf, believed to have been first posted on Feb. 6, 2006.

L.A. Momoda, The Future of Engineering Materials: Multifunction for Performance Tailored Structures, HRL Laboratories, available at http://www.nae.edu/nae/naefoe.nsf/weblinks/JHAY-65GJNW/$File/Momoda.pdf.

(Continued)

*Primary Examiner* — Thomas Dougherty
*Assistant Examiner* — Karen B Addison
(74) *Attorney, Agent, or Firm* — Kyle Eppele; J. Eric Anderson

(57) ABSTRACT

An artificial neuromuscular unit (ANMU) network comprising: a plurality of ANMUs, wherein each ANMU comprises an electroactive polymer (EAP) actuator layer and a uniquely addressable EAP logic layer coupled to the actuator layer; a plurality of inert, non-ion-conducting and non-charge-conducting interfaces mechanically coupled between the ANMUs such that the actuator layer of each ANMU is insulated from the actuator layers and logic layers of the other ANMUs; an EAP common conductor layer coupled to the logic layer of each ANMU such that the logic layer of each ANMU is interposed between the common conductor layer and the corresponding actuator layer; and wherein the logic layer of each ANMU is configured to control the transfer of energy to and from the common conductor layer and the corresponding actuator layer.

20 Claims, 7 Drawing Sheets

OTHER PUBLICATIONS

Peter G. Madden, John D. Madden, Patrick A. Anquetil, Hsiao-Hua Yu, Timothy M. Swager, and Ian W. Hunter, Conducting Polymers as Building Blocks for Biomimetic Systems, 2001 UUST Bio-Robotics Symposium, The University of New Hampshire, Aug. 27-29, 2001.

John D. Madden, Ryan A. Cush, Tanya S. Kanigan, Colin J. Brenan, Ian W. Hunter, Encapsulated Polypyrrole Actuators, Synthetic Metals 105_1999.61-64.

Ali Izadi-N. Ajafabadi, Dawn Th Tan and John D. Madden, Towards High Power Polypyrrole/Carbon Capacitors, Synthetic Metals, 152, 129-132, Part 1 Special Issue, 2005.

Michael Blackburn and Wayne McGinnis, Electroactive Polymer-Based Artificial Neuromuscular Units, Unpublished U.S. Appl. No. 12/421,467, filed Apr. 9, 2009, Navy Case 99200.

* cited by examiner

34

34

NETWORKED STRUCTURE OF ELECTROACTIVE POLYMER-BASED ARTIFICIAL NEUROMUSCULAR UNITS

FEDERALLY-SPONSORED RESEARCH AND DEVELOPMENT

This invention is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil. Reference Navy Case Number 99809.

BACKGROUND OF THE INVENTION

This electroactive polymer-based artificial neuromuscular unit relates generally to the field of structures comprising a plurality of electroactive polymer (EAP) elements. Electrical energy is customarily distributed to individual polymer strands of a given EAP element by electrical conductors. While masses of polymer strands have been bundled together and activated in concert, no adequate method has existed for the coordination and individual control of sequences of polymer strands in structures comprising multiple EAP elements.

SUMMARY

Several electroactive polymer-based artificial neuromuscular units (ANMUs) may be joined together in a network comprising: a plurality of ANMUs, wherein each ANMU comprises an electroactive polymer actuator layer and a uniquely addressable electroactive polymer logic layer coupled to the actuator layer; a plurality of inert, non-ion-conducting and non-charge-conducting interfaces mechanically coupled between the ANMUs such that the actuator layer of each ANMU is insulated from the actuator layers and logic layers of the other ANMUs; an electroactive polymer common conductor layer coupled to the logic layer of each ANMU such that the logic layer of each ANMU is interposed between the common conductor layer and the corresponding actuator layer; and wherein the logic layer of each ANMU is configured to control the transfer of energy to and from the common conductor layer and the corresponding actuator layer.

BRIEF DESCRIPTION OF THE DRAWINGS

Throughout the several views, like elements are referenced using like references. The elements in the figures are not drawn to scale as some dimensions are exaggerated for clarity.

DETAILED DESCRIPTION OF EMBODIMENTS

Electroactive polymers (EAPs) can be configured to function as conductors, batteries, sensors, actuators, and logic elements. An artificial neuromuscular unit (ANMU) may be produced by integrating several EAP elements with different functionality. The integration of several EAP elements, each with different functionality is disclosed in U.S. patent application Ser. No. 12/421,467, filed 9 Apr. 2009 by Blackburn et al., which is incorporated by reference herein in its entirety.

Figure 1A:
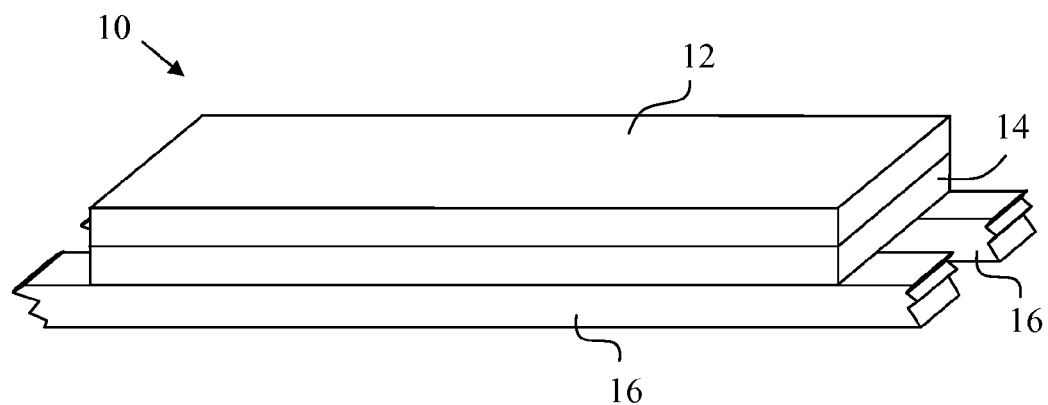
FIG. 1A is a perspective view of an artificial neuromuscular unit.

FIG. 1A shows a perspective view of an ANMU 10 comprising an actuator layer 12, a logic layer 14, and a conductor layer 16. The actuator layer 12 may be any EAP element capable of deflection when activated. Each ANMU 10 may be any desired size or shape. The logic layer 14 is a uniquely addressable EAP element that is coupled to the actuator layer 12. The conductor layer 16 is an EAP element that is coupled to the logic layer 14 such that the logic layer 14 is interposed between the conductor layer 16 and the actuator layer 12. The logic layer 14 is configured to gate energy from the conductor layer 16 to the actuator layer 12.

Figure 1B:
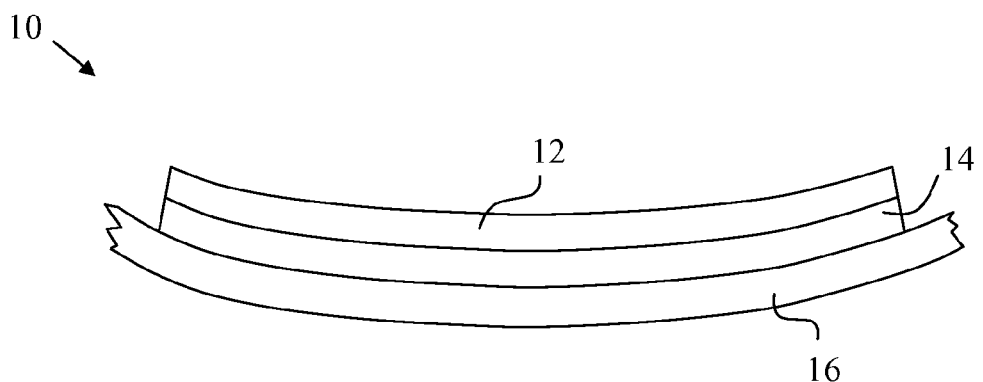
FIG. 1B is a side view of a deflected artificial neuromuscular unit.

The actuator layer 12 is the artificial muscle of the ANMU 10 and causes all of the ANMU 10 layers to deflect together with its activation. The type of deflection is a bending or curling of the polymer on the dimension orthogonal to the longitudinal axis of the actuator layer 12, as shown in FIG. 1B. Passive bending of the ANMU 10 by external forces also deflects all layers. Some types of polymers, when used as activators, also generate electrical currents with passive deflection. The actuator layer 12 may be made from, but is not limited to, the following materials: polypyrrole, polyaniline, and/or an ionic polymer metal composite (IPMC). Other examples of electroactive polymer actuators may be found in the following references: J. Madden, N. Vandesteeg, P. A. Anquetil, P. G. Madden, A. Takshi, R. R. Pytel, S. R. Lafontaine, P. A. Wiering a, and I. W. Hunter, *Artificial Muscle Technology: Physical Principles and Naval Prospects, IEEE Journal of Oceanic Engineering*, July 2004; Y. Bar-Cohen (editor), *Electroactive Polymer (EAP) Actuators as Artificial Muscles, Reality, Potential, and Challenges*, Second Edition, S.P.I.E, March 2004; and G. G. Walace, G. M. Spinks, L. A. P. Maguire, P. R. Teasdale, *Conductive Electroactive Polymers*, $2^{nd}$ edition (2003), CRC Press LLC, 2000 N.W. Corporate Blvd., Boca Raton, Fla. 33431.

The EAP-based logic layer 14 governs the potentials applied to the actuator layer 12 thus controlling activation. The logic layer 14 may be composed of EAP-based semiconductors. In instances of electrical current generation due to passive deflection of the actuator layer 12, the logic layer 14 may direct the generated current into the conductor layer 16 or into an energy storage layer 18, shown in FIG. 2 and described below. The logic layer 14 may be manufactured by contemporary inkjet printing processes, as known in the art, or their equivalents.

The EAP-based conductor layer 16 is configured to communicate central control signals and power to and from the logic layer 14. The conductor layer 16, like the logic layer 14, may be manufactured by contemporary inkjet printing processes, as know in the art, or their equivalents. All EAP layers of the ANMU 10, excepting the actuator layer 12, may be manufactured by inkjet printing processes and bonded to the actuator layer 12.

Figure 2A:
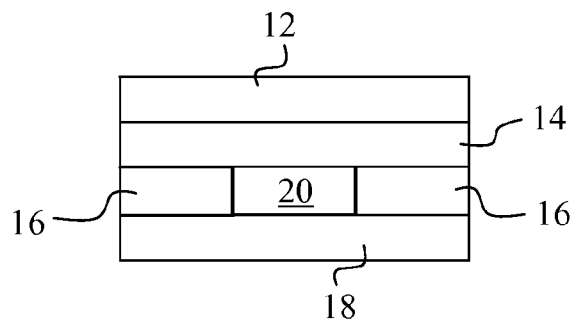
FIG. 2A is an end view of an embodiment of an artificial neuromuscular unit.
Figure 2B:
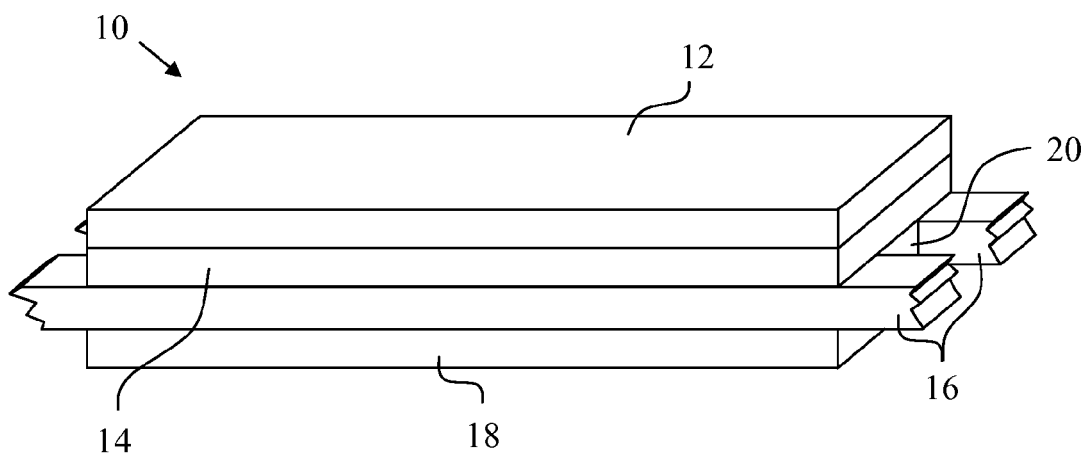
FIG. 2B is a perspective view of the artificial neuromuscular unit shown in FIG. 2A.

FIGS. 2A-2B show an idealized alternative embodiment of the ANMU 10 comprising an EAP-based energy storage layer 18 and an EAP-based sensor element 20. The energy storage layer 18 is electrically coupled to the logic layer 14 such that the logic layer 14 is configured to gate energy to and from the energy storage layer 18, the conductor layer 16, and the actuator layer 12. The sensor element 20 is configured to provide electrical signals to the logic layer 14 that are proportional to ANMU 10 deflection. Thus, the sensor element 20 is disposed to communicate deflections of the actuator layer 12 to the logic layer 14. The energy storage layer 18 serves as an energy reserve and buffer. Suitable, non-limiting examples of the storage layer 18 include a polymer-based battery and a polymer-based super capacitor. EAP-based sensors, such as the sensor element 20, can measure both stress and strain, through the measurement of changes in voltage, capacitance, and resistance with applied forces, depending upon the type of polymer employed.

Figure 3:
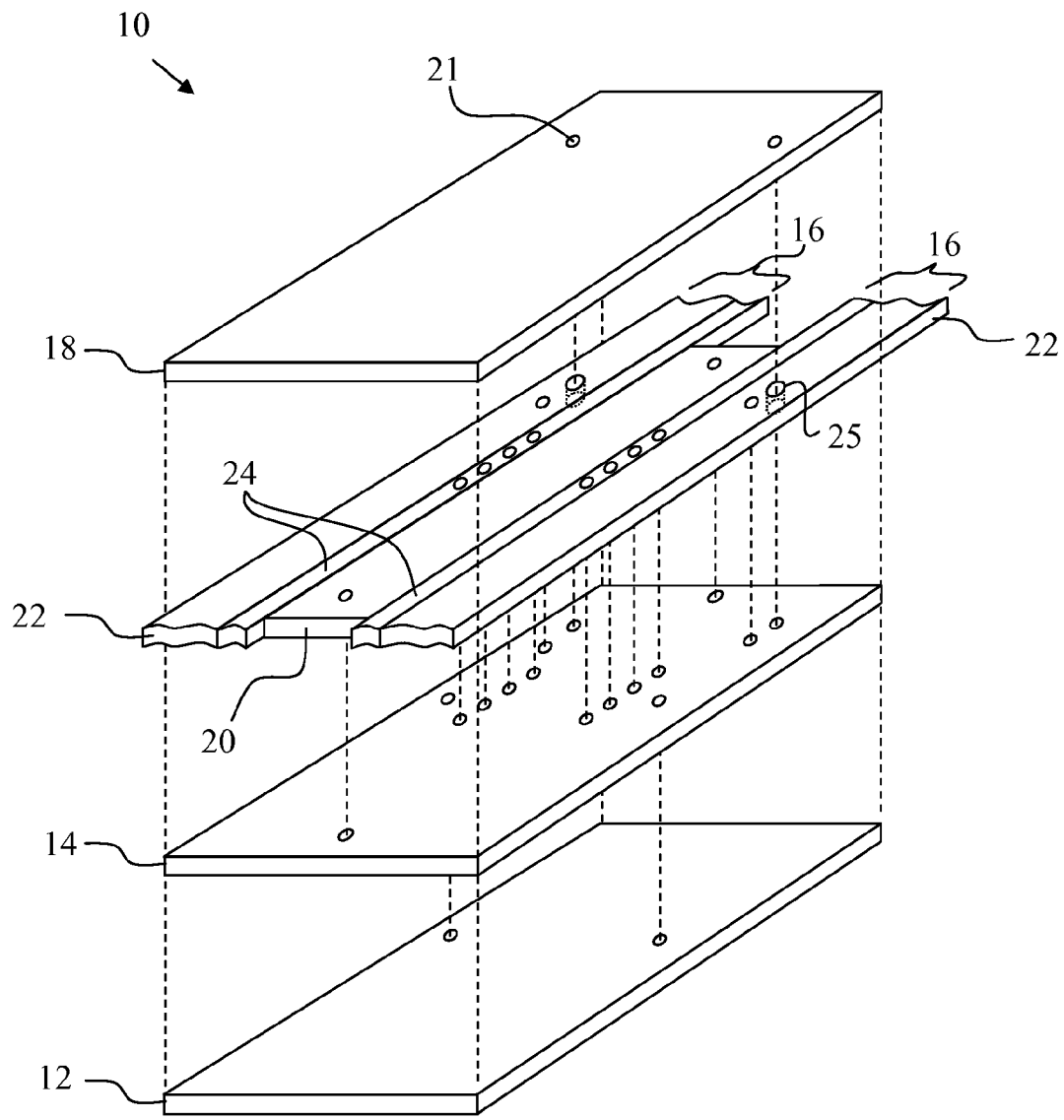
FIG. 3 is an expanded view of an embodiment of an artificial neuromuscular unit.

FIG. 3 is an expanded view of another embodiment of the ANMU 10 showing some of the vertical connectivity between some of the layers. Terminal connection points 21 are represented in FIG. 3 as small circles. FIG. 3 also shows the conductor layer 16 comprising an energy bus 22 and an information bus 24. Conduction of electrical energy vertically through the ANMU 10 from and to the energy bus 22 of the conductor layer 16 may be controlled by the logic layer 14. The logic layer 14 may be configured to read its unique address from the information stream on the information bus 24 and respond to commands to activate its associated actuator layer 12. The logic layer 14 would accomplish activation by gating energy available on the energy bus 22 to the actuator layer 12, or by directing the stored energy in the associated energy storage layer 18 to the actuator layer 12. The vertical connection of the logic layer 14 and the energy storage layer 18 is shown in FIG. 3 as passing through the conductor layer 16 by way of vias 25. The logic layer 14 may recharge the energy storage layer 18 by directing energy available from the energy bus 22 of the conductor layer 16 to the energy storage layer 18. The logic layer 14 may also be configured to sample the back voltages resulting from the deflections of the actuator layer 12 by external forces and direct that energy to the energy storage layer 18. The sensor element 20 responds to deflections of the ANMU 10 and communicates proportional signals to the logic layer 14 that may be used to assist regulation of the actuator element 12.

Figure 4A:
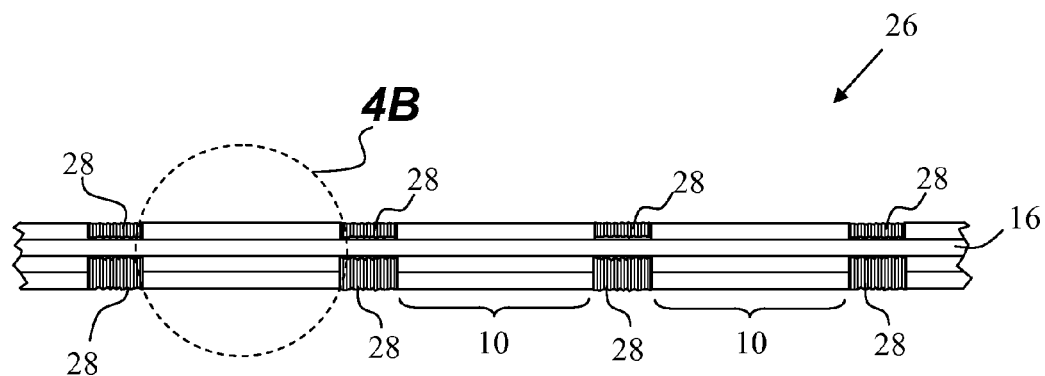
FIG. 4A is a side view of a sequence of artificial neuromuscular units.

ANMUs 10 may act singly or in a network. FIGS. 4A-AB show an ANMU sequence 26 comprising multiple ANMUs 10 connected by a common conductor layer 16 and by non-ion-conducting and non-charge-conducting interfaces 28. An ANMU sequence 26 comprises at least two ANMU 10 and one interface 28 connected in series. In the embodiment of the ANMU sequence 26 shown in FIGS. 4A-4B, energy and information may be moved from one ANMU 10 to the next via the energy bus 22 and the information bus 24 respectively of the conductor layer 16. The energy bus 22 and the information bus 24 are not shown in FIGS. 4A-4B for the sake of clarity. An ANMU sequence 26 may be formed by connecting the logic layers 14 of each ANMU 10 with the common conductor layer 16, and by connecting all like-layers of neighboring ANMUs 10 with the inert, insulating interfaces 28.

Figure 4B:
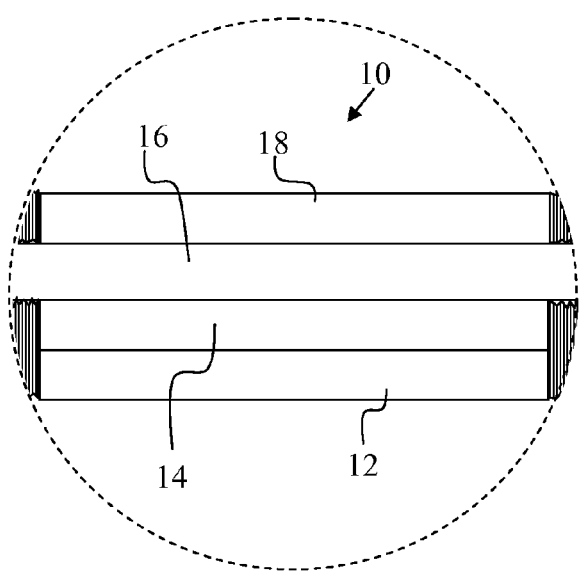
FIG. 4B shows an enlarged section of the sequence shown in FIG. 4A.

In the embodiment shown in FIGS. 4A-4B, the common conductor layer 16 would be the principal method of distributing and sharing energy amongst the various ANMU 10 in each ANMU sequence 26. The conductor layer 16 may be configured to convey trigger commands to the logic layers 14 of the individual ANMUs 10 in the ANMU sequence 26, and to convey central commands to regulate multiple ANMUs 10 based on pooled sensor information.

The insulating interfaces 28 provide mechanical coupling between the ANMUs 10 while the common conductor layer 16 provides electrical coupling between the ANMUs 10. The ANMUs 10 are capable of cooperative action when they are in an ANMU sequence 26 or in a braid of ANMU sequences 26, described below. Due to its embedded logic, each ANMU 10 is uniquely addressable. In a network, each ANMU 10 may be electrically and mechanically isolated on one or more contact planes with any and all other similar ANMUs 10, while connected electrically through logic-gated conductors with selected neighboring ANMUs 10. Networked ANMUs may also be connected mechanically to neighboring ANMUs 10 through the inert interfaces 28 with selected neighboring ANMUs 10 on their longitudinal axes. Some ANMUs 10 of the sequence may terminate on levers or anchors, while in other architectures all ANMUs 10 mechanically connect only to other ANMUs 10. The common conductor layer 16 may be configured to be coupled to a central controller 30, shown in FIG. 5. Each logic layer 14 may be configured to communicate the state and dynamics of its corresponding ANMU 10 via the information bus 24 to the central controller 30. The logic layer 14 may also be configured to gate stored energy in the energy storage layer 18 into the energy bus 22 to recharge neighboring ANMUs 10, or to recharge a central energy source, shown in FIG. 5.

Figure 5:
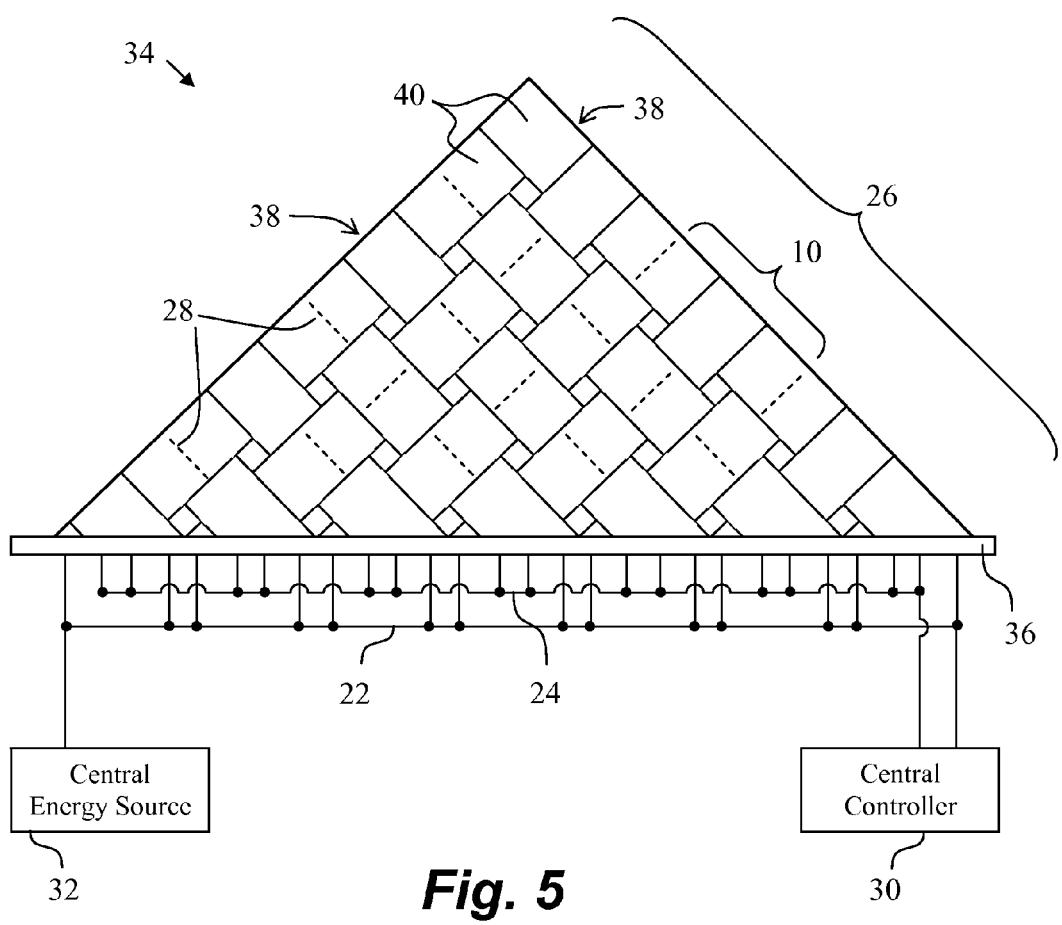
FIG. 5 is a top view of an electroactive polymer structure comprising woven sequences of artificial neuromuscular units.

FIG. 5 is a top view of an embodiment of an ANMU network 34 comprising several ANMU sequences 26 woven together into a triangular structure. The ANMU sequences 26 may be woven together to form an ANMU network 34 of any size or shape. While FIG. 5 depicts the ANMU network 34 in a triangular structure, it is to be understood that the ANMU network 34 may be any desirable shape. U.S. Pat. No. 7,193, 350 to Blackburn et al., which is incorporated by reference herein in its entirety, provides other examples of EAP structures comprising multiple EAP elements. The example embodiment of the ANMU network 34 shown in FIG. 5 is conceived to function as an artificial fin. The scale of the figure is distorted for clarity in presentation.

In a practical application, more or fewer ANMUs 10 and ANMU sequences 26 and variations in the braid pattern may be required. In FIG. 5, fourteen ANMU sequences 26 are represented. Together, the fourteen ANMU sequences 26 comprise thirty two individual ANMUs 10 of various lengths. All the ANMU sequences 26 of the ANMU network 34 shown in FIG. 5 are each connected at one terminal end to an anchor bar 36 while the other terminal end is connected to the outboard edges 38 of the two fin-edge sequences 40. Those ANMUs 10 in the interior of the braid would be free to slide against their perpendicular neighbors. The visible dotted lines shown on the ANMU sequences 26 represent the interfaces 28 or, in other words, the divisions of the ANMU sequences 26 into individual ANMUs 10. For the sake of clarity, not all the interfaces 28 for each ANMU sequence 26 are shown in FIG. 5. The energy bus 22 and the information bus 24 of each ANMU sequence 26 pass through the anchor bar 36. The energy buses 22 are connected to the central energy source 32, and information buses 24 are connected to the central controller 30. The central controller 30 may be configured to draw power from the central energy source 32.

The common conductor layer 16 also makes possible the communications among ANMU logic layers 14 necessary for coordination among neighboring ANMU 10 in an ANMU sequence 26 in the absence of a central controller 30, or otherwise reducing the need for extensive central control. Distributed controllers can accomplish complex sequencing with adequate feedback, so the local ANMU logic layers 14 will need to share sensor information as well as energy. In an alternative embodiment, a logic layer 14 from at least one ANMU 10 may have an embedded radio frequency (RF) transceiver to enable the central controller 30 to communicate with at least one logic layer 14 in the absence of a physical connection between the common conductor 16 and the central controller 30. The purpose of a central controller 30, whether connected by a common conductor 16 or by RF link to the ANMU network 34, is to ensure that the ANMU network 34 will perform according to the user's expectations.

Figure 6A:
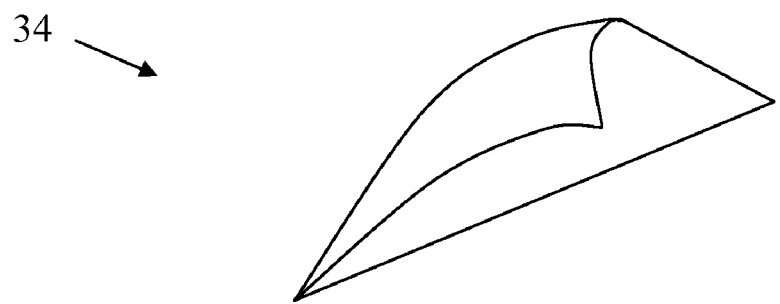
FIGS. 6A-6C are perspective views of the electroactive polymer structure of FIG. 5 in various positions.
Figure 6B:
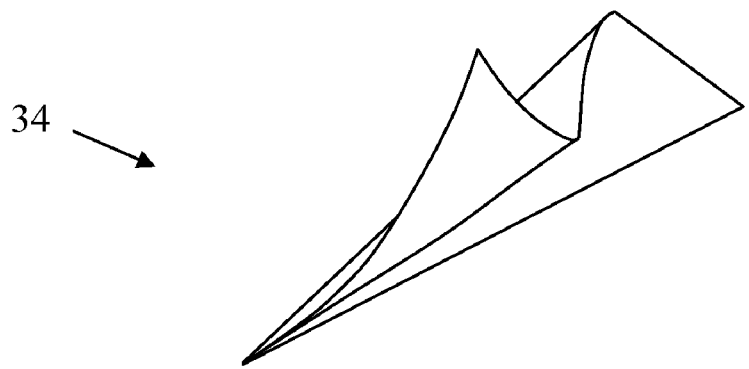
Figure 6C:
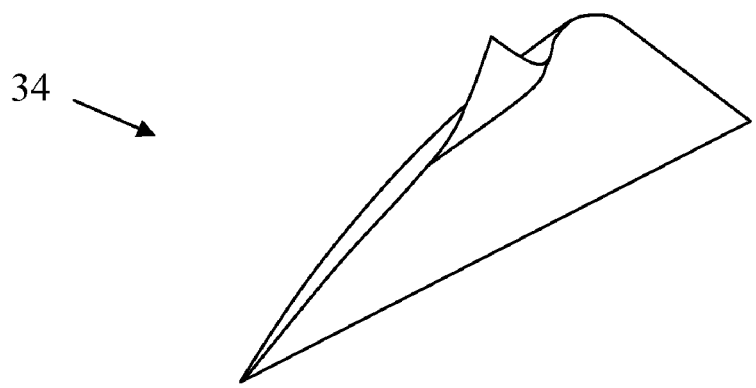

FIGS. 6A-6C are perspective views of the fin structure shown in FIG. 5. FIGS. 6A-6C show how the fin structure of FIG. 5 might be articulated to move a liquid, such as water, by means of selective and coordinated activation of the various ANMUs 10 in the ANMU network 34. The fin structure, once coupled to an object, could propel the object through a liquid by means of a series of coordinated movements as depicted in FIGS. 6a-6C.

Figure 7A:
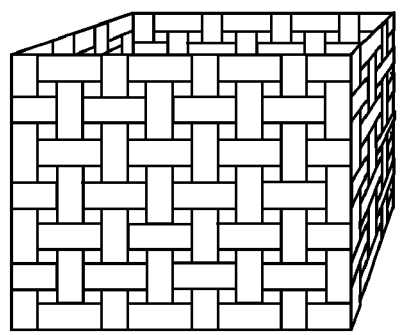
FIGS. 7A-7B are perspective views of an electroactive polymer structure in a variety of shape configurations.
Figure 7B:
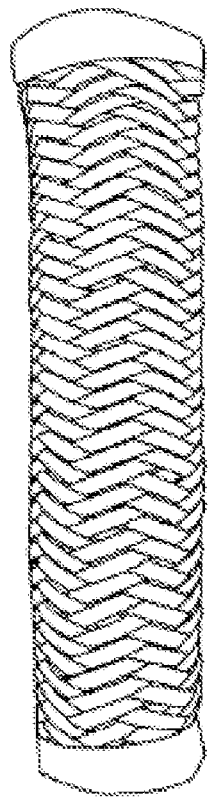

FIGS. 7A-7B are perspective views of the ANMU network 34 in a variety of shape configurations. FIG. 7A illustrates an embodiment of the ANMU network 34 in the shape of a rectangular box. FIG. 7B shows an embodiment of the ANMU network 34 in the shape of a cylinder. The embodiments of the ANMU network 34 shown in the figures herein are shown by way of example and it is to be understood that the ANMU network 34 can be any desired size or shape.

Any of the embodiments disclosed herein, the ANMU sequence(s) 26 may be encapsulated providing for the preservation of electrolyte solutions and for the reduction in friction among moving sequences. For example, and not by way of limitation, the ANMU sequences 26 may be encapsulated in an agar gel enclosed by a polyethelene sheath in a manner similar to that discussed by Madden et al. with respect to polypyrrole actuators. (J. D. Madden, R. A. Cush, T. S. Kanigan, C. J. Brenan, and I. W. Hunter; *Encapsulated polypyrrole actuators, Synthetic Metals*, vol. 105, pp. 61-64, 1999).

From the above description of the ANMU network 34, it is manifest that various techniques may be used for implementing the concepts described above without departing from the scope of the claims. The described embodiments are to be considered in all respects as illustrative and not restrictive. It should also be understood that the ANMU network 34 is not limited to the particular embodiments described herein, but is capable of many embodiments without departing from the scope of the claims.

We claim:

1. An artificial neuromuscular unit (ANMU) network comprising:
    a plurality of ANMUs, wherein each ANMU comprises an electroactive polymer actuator layer and a uniquely addressable electroactive polymer logic layer coupled to the actuator layer;
    a plurality of inert, non-ion-conducting and non-charge-conducting interfaces mechanically coupled between the ANMUs such that the actuator layer of each ANMU is insulated from the actuator layers and logic layers of the other ANMUs;
    an electroactive polymer common conductor layer coupled to the logic layer of each ANMU such that the logic layer of each ANMU is interposed between the common conductor layer and the corresponding actuator layer; and
    wherein the logic layer of each ANMU is configured to control the transfer of energy to and from the common conductor layer and the corresponding actuator layer.

2. The ANMU network of claim 1, wherein each ANMU further comprises an energy storage layer coupled to the corresponding logic layer and wherein each logic layer is configured to control the transfer of energy between the corresponding energy storage layer, the corresponding actuator layer, and the common conductor layer.

3. The ANMU network of claim 2, wherein the energy storage layers are polymer-based batteries.

4. The ANMU network of claim 2, wherein the energy storage layers are polymer-based super capacitors.

5. The ANMU network of claim 3, wherein at least one of the ANMU further comprises a sensor element operatively coupled to the corresponding actuator layer and the corresponding logic layer, wherein each sensor element is configured to communicate deflections of the corresponding actuator layer to the corresponding logic layer.

6. The ANMU network of claim 5, wherein the ANMU network is encapsulated in an electrolyte solution.

7. The ANMU network of claim 5, wherein the common conductor layer comprises an energy bus and an information bus.

8. The ANMU network of claim 7, wherein the common conductor layer is configured to be coupled to a central controller and wherein each logic layer is configured to communicate the state and dynamics of its corresponding ANMU via the information bus to the central controller.

9. The ANMU network of claim 8, wherein the plurality of ANMUs and interfaces are coupled together in series to form a sequence.

10. The ANMU network of claim 8, wherein the plurality of ANMUs and interfaces are coupled together to form a plurality of sequences, wherein each sequence comprises at least one ANMU and an interface coupled in series, and wherein the sequences are braided together to form a woven mesh of sequences.

11. The ANMU network of claim 10, wherein at least one ANMU is mechanically coupled to an anchor.

12. The ANMU network of claim 10, wherein at least one ANMU is mechanically coupled to a lever.

13. The ANMU network of claim 10, wherein the woven mesh of sequences forms a structure that is designed to move liquid upon selective and coordinated activation of individual ANMUs.

14. The ANMU network of claim 10, wherein the woven mesh of sequences is fin-shaped and configured to undulate.

15. The ANMU network of claim 10, wherein the woven mesh of sequences is box-shaped.

16. The ANMU network of claim 10, wherein the woven mesh of sequences forms a cylindrical structure.

17. The ANMU network of claim 10, wherein the woven mesh of sequences forms a structure, wherein the mechanical and surface properties of the structure are alterable by selective activation of individual ANMUs.

18. The ANMU network of claim 10, wherein the woven mesh of sequences is configured to function as the muscle in a prosthetic member.

19. An artificial neuromuscular apparatus comprising:
    a plurality of artificial neuromuscular sequences woven together to form a loose mesh, each artificial neuromuscular sequence comprising:
        at least two artificial neuromuscular units (ANMUs), wherein each ANMU comprises an electroactive polymer (EAP) actuator layer, a uniquely addressable EAP logic layer coupled to the actuator layer, and an energy storage layer coupled to the logic layer, at least one inert, non-ion-conducting and non-charge-conducting interface mechanically coupled in series between the ANMUs such that the actuator layer of each ANMU is insulated from the actuator layers and logic layers of the other ANMUs, an EAP common conductor layer comprising an energy bus and an information bus, wherein the energy bus and the information bus are coupled to the logic layer of each ANMU, wherein the logic layer of each ANMU is configured to control the transfer of energy between the corresponding energy storage layer, the corresponding actuator layer, and the common conductor layer;

a central controller electrically coupled to the information buses of each artificial neuromuscular sequence; and a central energy source electrically coupled to the central controller and the energy buses of each artificial neuromuscular sequence.

20. The artificial neuromuscular apparatus of claim 19, wherein each artificial neuromuscular sequence further comprises at least one ANMU that further comprises a sensor element operatively coupled to the corresponding actuator layer and the corresponding logic layer, wherein the sensor element is configured to communicate deflections of the corresponding actuator layer to the corresponding logic layer.

\* \* \* \* \*